United States Patent
Avila et al.

(10) Patent No.: US 8,971,119 B2
(45) Date of Patent: Mar. 3, 2015

(54) SELECT TRANSISTOR TUNING

(71) Applicant: SanDisk Technologies Inc., Plano, TX (US)

(72) Inventors: Chris Avila, Saratoga, CA (US); Yingda Dong, San Jose, CA (US); Man Mui, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/279,747

(22) Filed: May 16, 2014

(65) Prior Publication Data

US 2014/0247665 A1   Sep. 4, 2014

Related U.S. Application Data

(63) Continuation of application No. 13/801,800, filed on Mar. 13, 2013.

(60) Provisional application No. 61/738,951, filed on Dec. 18, 2012.

(51) Int. Cl.
| | |
|---|---|
| *G11C 11/34* | (2006.01) |
| *G11C 16/10* | (2006.01) |
| *G11C 16/34* | (2006.01) |
| *G11C 16/24* | (2006.01) |
| *G11C 29/02* | (2006.01) |
| *G11C 29/04* | (2006.01) |

(52) U.S. Cl.
CPC .......... *G11C 16/107* (2013.01); *G11C 16/3404* (2013.01); *G11C 16/24* (2013.01); *G11C 29/02* (2013.01); *G11C 29/024* (2013.01); *G11C 29/028* (2013.01); *G11C 2029/0409* (2013.01)
USPC ................................................ 365/185.17

(58) Field of Classification Search
USPC ................................................ 365/185.17
See application file for complete search history.

(56) References Cited

U.S. PATENT DOCUMENTS

| | | | |
|---|---|---|---|
| 5,070,032 | A | 12/1991 | Yuan et al. |
| 5,095,344 | A | 3/1992 | Harari |
| 5,313,421 | A | 5/1994 | Guterman et al. |
| 5,315,541 | A | 5/1994 | Harari et al. |
| 5,343,063 | A | 8/1994 | Yuan et al. |
| 5,570,032 | A | 10/1996 | Atkins et al. |
| 5,570,315 | A | 10/1996 | Tanaka et al. |
| 5,595,924 | A | 1/1997 | Yuan et al. |
| 5,661,053 | A | 8/1997 | Yuan |
| 5,768,192 | A | 6/1998 | Eitan |
| 5,903,495 | A | 5/1999 | Takeuchi et al. |
| 6,011,725 | A | 1/2000 | Eitan |
| 6,046,935 | A | 4/2000 | Takeuchi et al. |

(Continued)

OTHER PUBLICATIONS

U.S. Appl. No. 13/791,200 entitled "Optimized Configurable NAND Parameters," filed Mar. 8, 2013, 37 pages.

(Continued)

*Primary Examiner* — Anthan Tran
(74) *Attorney, Agent, or Firm* — Davis Wright Tremaine LLP

(57) ABSTRACT

In a nonvolatile memory array in which a select transistor includes a charge storage element, the threshold voltage of the select transistor is monitored, and if the threshold voltage deviates from a desired threshold voltage range, charge is added to, or removed from the charge storage element to return the threshold voltage to the desired threshold voltage range.

14 Claims, 12 Drawing Sheets

(56) References Cited

U.S. PATENT DOCUMENTS

| | | |
|---|---|---|
| 6,222,762 B1 | 4/2001 | Guterman et al. |
| 7,301,807 B2 | 11/2007 | Khalid et al. |
| 7,954,037 B2 | 5/2011 | Lasser et al. |
| 8,039,886 B2 | 10/2011 | Mizukami et al. |
| 8,472,257 B2 | 6/2013 | Dong et al. |
| 8,569,809 B2 | 10/2013 | Thomas et al. |
| 2003/0195714 A1 | 10/2003 | Jeddeloh |
| 2008/0137422 A1 | 6/2008 | Hosono |
| 2008/0158983 A1 | 7/2008 | Mokhlesi et al. |
| 2009/0129146 A1 | 5/2009 | Sarin et al. |
| 2009/0135656 A1 | 5/2009 | Park |
| 2009/0268523 A1 | 10/2009 | Maejima |
| 2009/0268524 A1 | 10/2009 | Maejima |
| 2010/0023800 A1 | 1/2010 | Harari |
| 2010/0097858 A1 | 4/2010 | Tokiwa et al. |
| 2010/0124118 A1 | 5/2010 | Hsu et al. |
| 2010/0157671 A1 | 6/2010 | Mokhlesi |
| 2010/0271891 A1 | 10/2010 | Dell et al. |
| 2010/0277983 A1 | 11/2010 | Mokhlesi et al. |
| 2011/0002172 A1 | 1/2011 | Kito et al. |
| 2011/0096601 A1 | 4/2011 | Gavens et al. |
| 2011/0131473 A1 | 6/2011 | Mokhlesi et al. |
| 2011/0170358 A1* | 7/2011 | Chen et al. ............... 365/185.19 |
| 2011/0188313 A1* | 8/2011 | Higashitani ............. 365/185.17 |
| 2011/0211392 A1 | 9/2011 | Kim et al. |
| 2011/0249503 A1* | 10/2011 | Yamada et al. .......... 365/185.19 |
| 2011/0280076 A1 | 11/2011 | Samachisa et al. |
| 2012/0057405 A1 | 3/2012 | Ogiwara et al. |
| 2012/0069667 A1 | 3/2012 | Shirakawa |
| 2012/0096328 A1 | 4/2012 | Franceschini et al. |
| 2012/0170365 A1 | 7/2012 | Kang et al. |
| 2012/0170375 A1 | 7/2012 | Sim et al. |
| 2012/0218836 A1 | 8/2012 | Ozawa |
| 2012/0220088 A1 | 8/2012 | Alsmeier |
| 2013/0055012 A1 | 2/2013 | Roh |
| 2013/0073924 A1 | 3/2013 | D'Abreu et al. |
| 2013/0107628 A1 | 5/2013 | Dong et al. |
| 2013/0258780 A1 | 10/2013 | Khouri et al. |
| 2013/0322174 A1 | 12/2013 | Li et al. |

OTHER PUBLICATIONS

U.S. Appl. No. 14/064,823, filed Oct. 28, 2013, 48 pages.

Eitan et al., "NROM: A Novel Localized Trapping, 2-Bit Nonvolatile Memory Cell," IEEE Electron Device Letters, vol. 21, No. 11, Nov. 2000, pp. 543-545.

Technical Search Report dated Jan. 9, 2013, 8 pages.

Notification of Transmittal of the International Search Report and the Written Opinion of the International Searching Authority, or the Declaration of Int'l Patent Appl. No. PCT/US2013/073120 mailed Mar. 27, 2014, 12 pages.

Office Action for U.S. Appl. No. 13/801,800 mailed Aug. 11, 2014, 15 pages.

Office Action for U.S. Appl. No. 13/801,800 mailed Dec. 4, 2014, 13 pages.

* cited by examiner

Programming into four states represented by a 2-bit code

SELECT TRANSISTOR TUNING

CROSS REFERENCE TO RELATED APPLICATIONS

This application is a continuation of U.S. application Ser. No. 13/801,800 filed Mar. 13, 2013, which claims the benefit of U.S. Provisional Patent Application No. 61/738,951, filed on Dec. 18, 2012, which is hereby incorporated by reference in its entirety.

BACKGROUND

This application relates to the operation of re-programmable non-volatile memory systems such as semiconductor flash memory which record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

Examples of the present invention relate to schemes to monitor select transistors and dummy transistors and to return their threshold voltages to desired ranges if they deviate from those ranges. In certain 3-dimensional memory arrays, select transistors include charge storage elements that may come to contain some charge (even if charge is never deliberately stored there). In order to maintain select transistors in a specified range, threshold voltages of select transistors may be determined, and charge may be added or removed as needed. Similarly, dummy cells may have their threshold voltages checked and restored to a desired range.

An example of a method of operating a 3-D charge-storage memory array includes: determining a threshold voltage of a select transistor that is connected in series with a string of memory cells; comparing the threshold voltage of the select transistor with a desirable range of select transistor threshold voltage; and in response to determining that the threshold voltage of the select transistor is outside of the desirable range of select transistor threshold voltage, performing an operation to change the threshold voltage of the select transistor.

The operation to change the threshold voltage may add charge to a charge storage element of the select transistor. The operation to change the threshold voltage may remove charge from the charge storage element of the select transistor. The operation to change the threshold voltage may first remove charge from a charge storage element of the select transistor and may then add charge to the charge storage element of the select transistor. A threshold voltage of a dummy memory cell that is connected in series with the string of memory cells may also be determined, the dummy memory cell containing no data. The determining, the comparing, and the performing may be steps in an initialization for the 3-D charge-storage memory array. The determining, the comparing, and the performing may be steps performed in response to a triggering event after the 3-D charge storage memory array has been used for a period of time. The triggering event may be either: (a) the period of time exceeds a predetermined threshold, (b) the select transistor experiences wear that exceeds a predetermined amount, or (c) Error Correction Code (ECC) results indicate increased errors in the string of memory cells that is connected in series with the select transistor.

An example of a method of operating a 3-D charge-storage memory array includes: determining a threshold voltage of a dummy memory cell that is not used to store data, the dummy memory cell connected in series in a string of memory cells that are used to store data, and with at least one select transistor that is used to selectively connect the string of memory cells to conductive lines; comparing the threshold voltage of the dummy memory cell with a desirable range of dummy memory cell threshold voltage; and in response to determining that the threshold voltage of the dummy memory cell is outside of the desirable range of dummy memory cell threshold voltage, performing an operation to change the threshold voltage of the dummy memory cell.

The operation to change the threshold voltage may add charge to a charge storage element of the dummy memory cell. The operation to change the threshold voltage may remove charge from the charge storage element of the dummy memory cell. The operation to change the threshold voltage may first remove charge from a charge storage element of the dummy memory cell and then add charge to the charge storage element of the dummy memory cell. The determining, the comparing, and the performing may be steps in an initialization for the 3-D charge-storage memory array. The determining, the comparing, and the performing may be steps performed in response to a triggering event after the 3-D charge storage memory array has been used for a period of time. The triggering event may be either: (a) the period of time exceeds a predetermined threshold, (b) the select transistor experiences wear that exceeds a predetermined amount, or (c) Error Correction Code (ECC) results indicate increased errors in the string of memory cells that is connected in series with the select transistor.

An example of a 3-D charge-storage memory array includes: a plurality of NAND strings that extend in a direction that is perpendicular to a surface of a substrate, each of the plurality of NAND strings having a select transistor at each end; a plurality of select lines that are connected to gates of the select transistors to selectively connect the plurality of strings to conductive lines; and resolving circuits that are configured to resolve a threshold voltage of a select transistor.

Charge-increasing circuits may be configured to increase the threshold voltage of the select transistor. Charge-decreasing circuits may be configured to decrease the threshold voltage of the select transistor.

An example of a 3-D charge-storage memory array includes: a plurality of NAND strings that extend in a direction that is perpendicular to a surface of a substrate, each of the plurality of NAND strings having a number N of cells for storing data, and at least one dummy cell that does not store data; a dummy word line that is coupled to the dummy cells; and resolving circuits that are configured to resolve threshold voltages of the dummy cells.

Charge-increasing circuits may be configured to increase the threshold voltage of the dummy cells. Charge-decreasing circuits may be configured to decrease the threshold voltage of the dummy cells.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
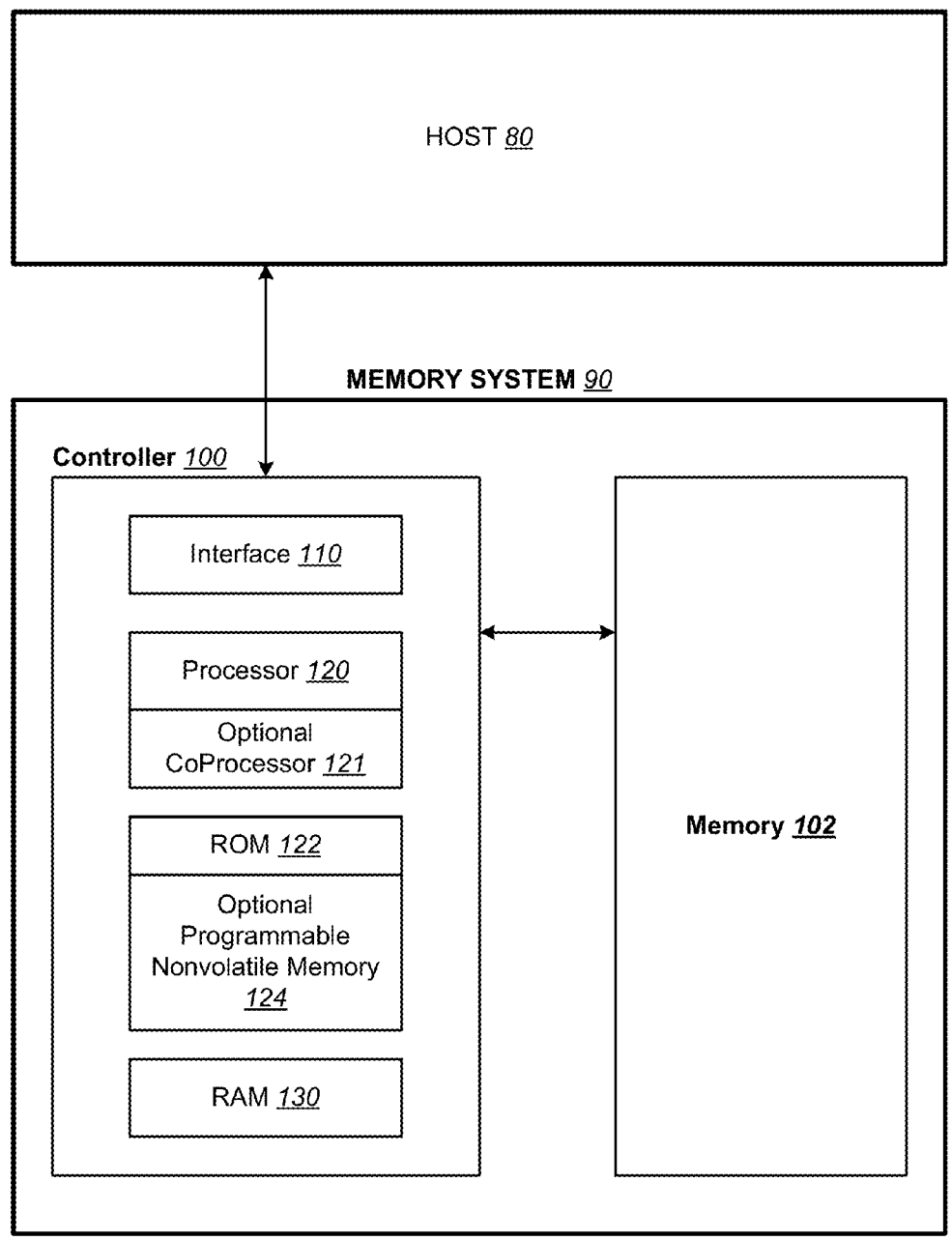
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
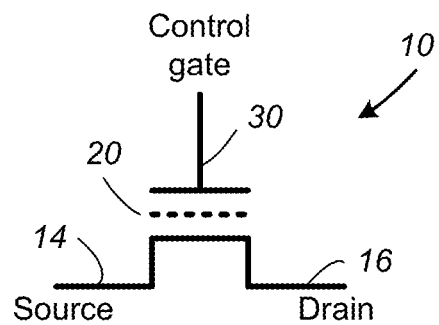
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
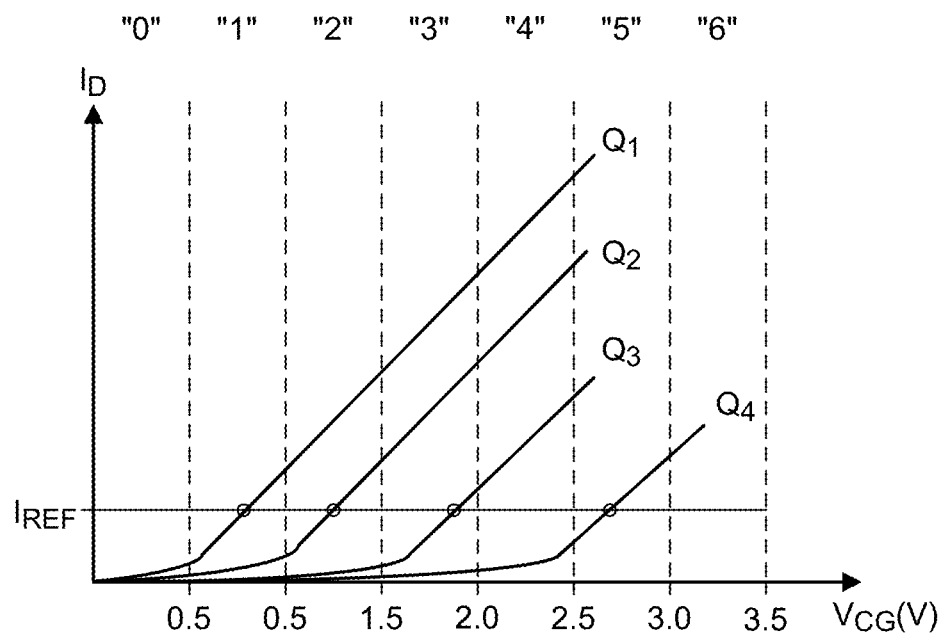
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
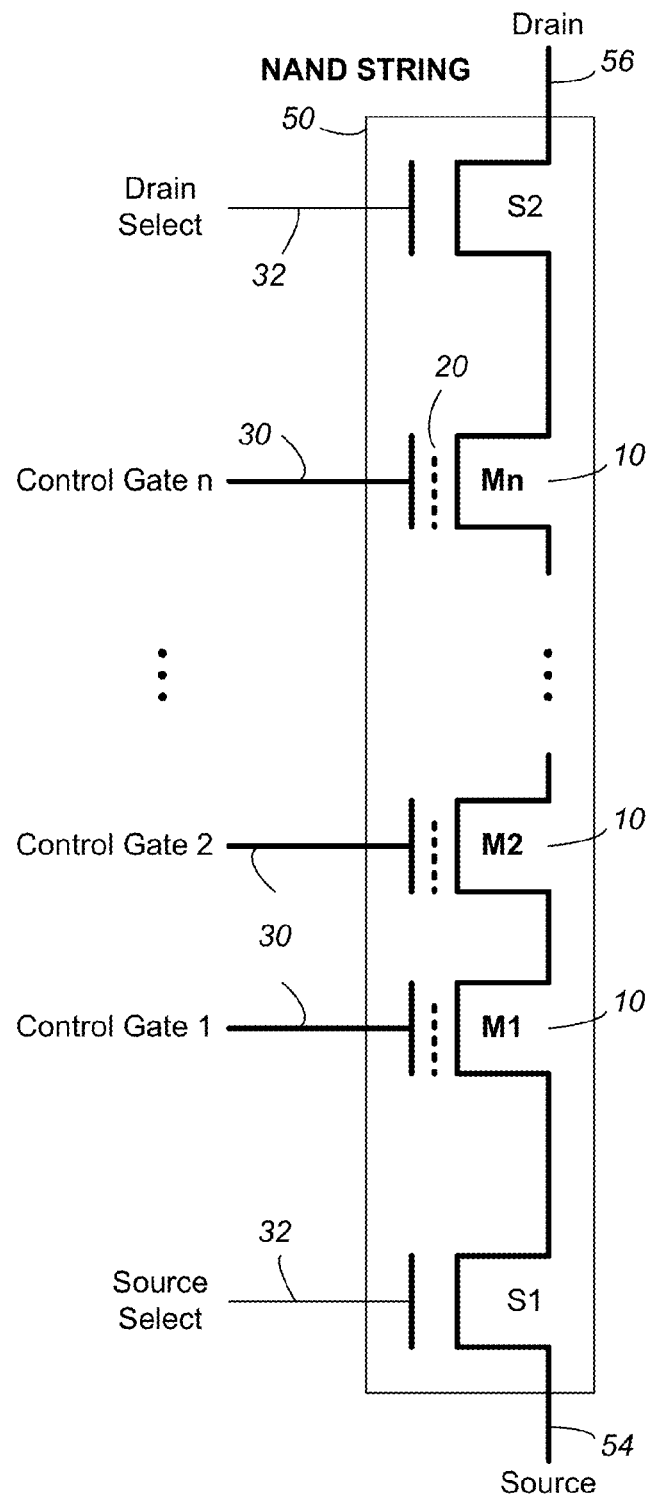
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor 51 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
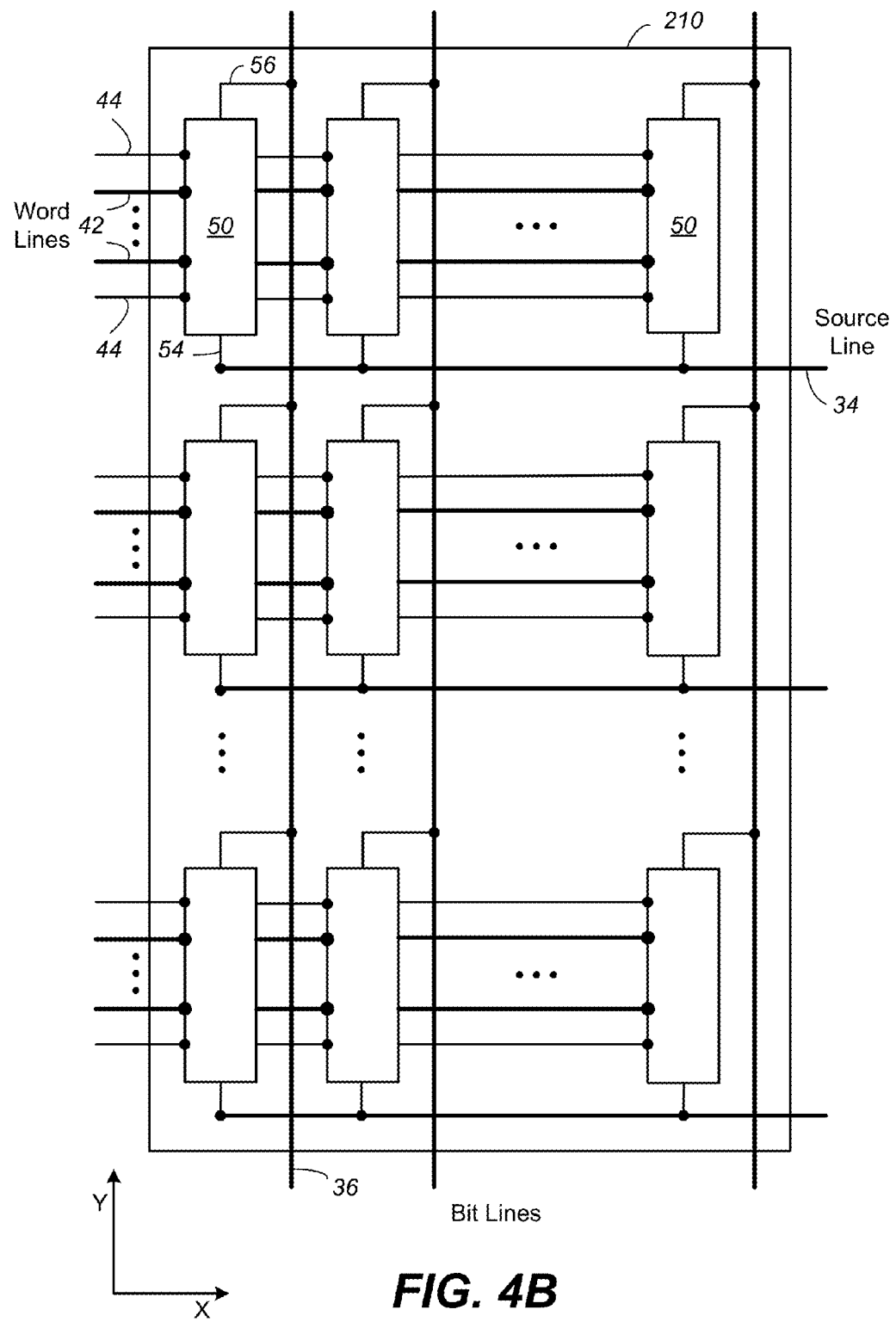
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
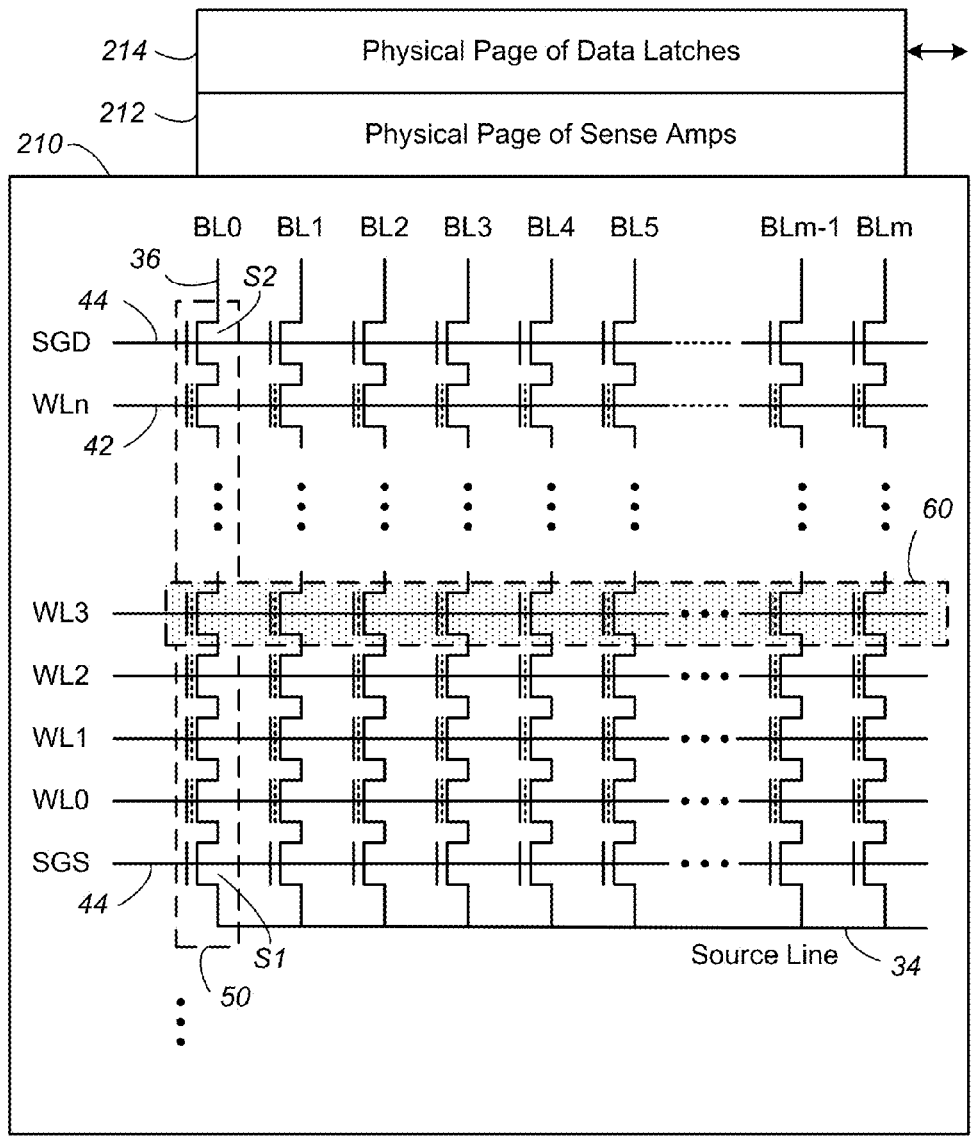
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 6:
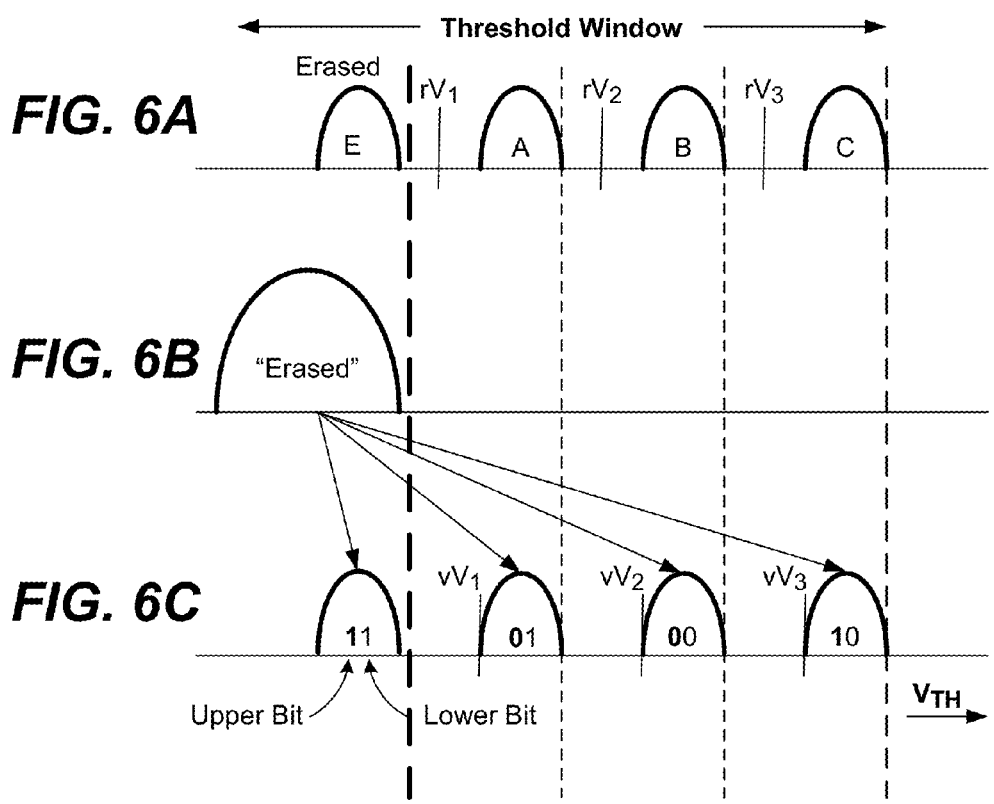
FIGS. 6A-6C illustrate an example of programming a population of 4-state memory cells.

FIG. 6A-6C illustrate an example of programming a population of 4-state memory cells. FIG. 6A illustrates the population of memory cells programmable into four distinct distributions of threshold voltages respectively representing memory states "0", "1", "2" and "3". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending up from the wafer surface. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088.

Figure 7:
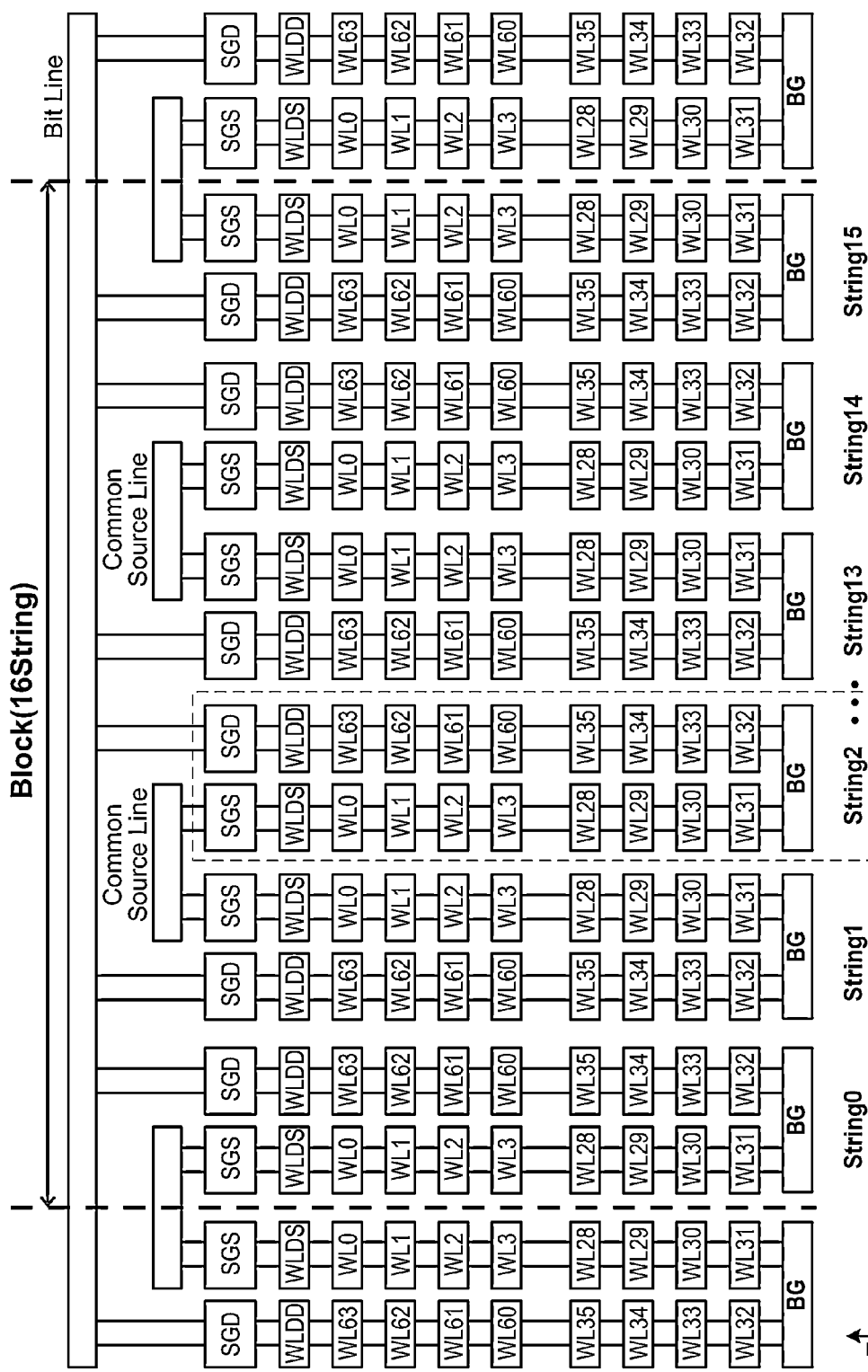
FIG. 7 shows an example of a physical structure of a 3-D memory array.

FIG. 7 shows a physical implementation of a 3-D NAND array. The bit line extends as a continuous conductor (e.g. metal line) in the y-direction with vertical connections formed between the bit line and drains of strings. Below the bit line, common source lines extend perpendicular to the cross section shown (i.e. extend in the x-direction) and connect sources of neighboring strings. Source select lines extend in the x-direction and form source select gates (SGS) where they intersect vertical columns. Drain select lines extend in the x-direction and form drain select gates (SGD) where they intersect vertical columns. Word lines WL0-WL63 extend in the x-direction and form control gates of memory cells where they intersect vertical columns. Dummy word lines are provided between word lines and select gates, with one dummy word line WLDS between the source select gate and word lines, and another dummy word line WLDD between the drain select gate and word lines. In one example, word lines, including dummy word lines, are formed from conductive layers separated by dielectric layers, with channels of memory cells being formed in vertical holes ("memory holes") that extend through the conductive layers and dielectric layers.

Figure 8:
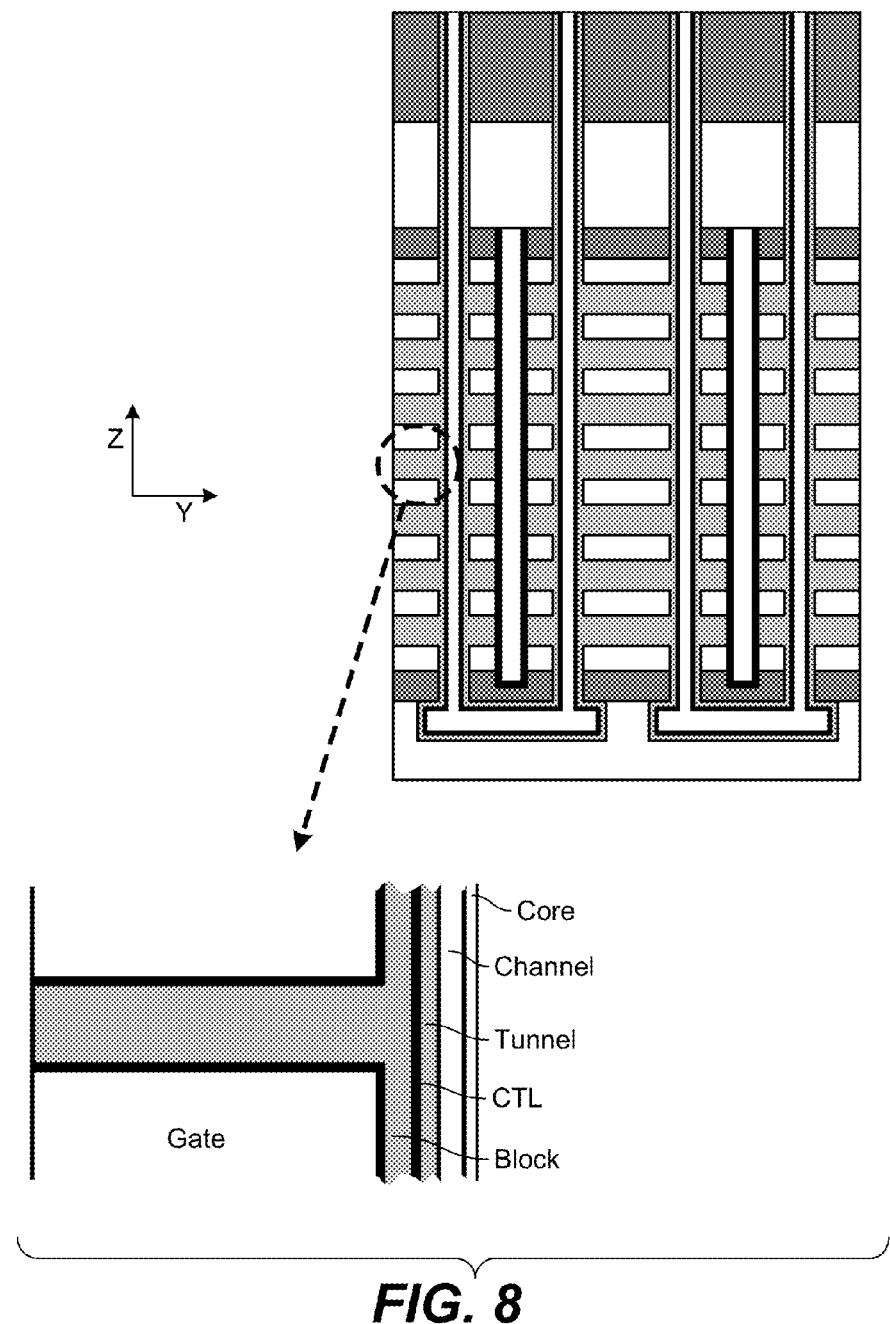
FIG. 8 shows detail of a physical structure of a 3-D memory array.

FIG. 8 shows the structure of a stack of layers in the memory holes that form memory cells. It can be seen that a blocking dielectric "Block" is deposited on the walls of the memory hole to provide electrical isolation. A Charge Trapping Layer (CTL) is deposited on the blocking dielectric. The CTL forms charge storage elements where the CTL is in close proximity to polysilicon word lines. A tunnel dielectric is deposited to provide electrical isolation and to allow charge to tunnel into the CTL under certain conditions. A channel material is deposited to form the channel of the memory cells along the string. A core material is deposited that forms the core of the column that is located in the memory hole.

When a NAND string is made using a memory hole, layers are deposited within the cylindrical memory hole so that the memory hole is filled in a substantially uniform manner with all deposited layers being present in at all levels (though some variation in memory hole diameter and other dimensions may occur). In contrast to planar NAND, where films deposited on a substrate surface can be patterned by photolithography, films deposited within a memory hole are generally not exposed in a manner that allows such patterning.

Select Transistors

One result of a uniform cylindrical structure like that shown in FIG. 8 is that select transistors are formed that contain charge storage elements. In planar NAND it is common to form select gates without charge storage elements. Two polysilicon layers (corresponding to floating gate layer and control gate layer) may be connected to form a single gate in a select transistor. Such connection requires an additional patterning step to form openings in inter-poly dielectric in select transistors (while leaving inter-poly dielectric intact in memory cells). Alternatively, a portion of a floating gate polysilicon or charge trapping layer may be removed from a select transistor. This also requires some patterning. Such additional patterning may not be possible in many 3-D memories. In general, there is no easy way to remove a portion of a charge trapping layer or otherwise eliminate a charge storage element from a select transistor in 3-D memory. Therefore, a select transistor may contain a charge storage element. While such a transistor may not be programmed with any data, the charge storage element may acquire or lose charge because of memory operations directed to memory cells (e.g. because of biases applied to the select gate and channel during read, write, or erase operations directed to memory cells).

Figure 9:
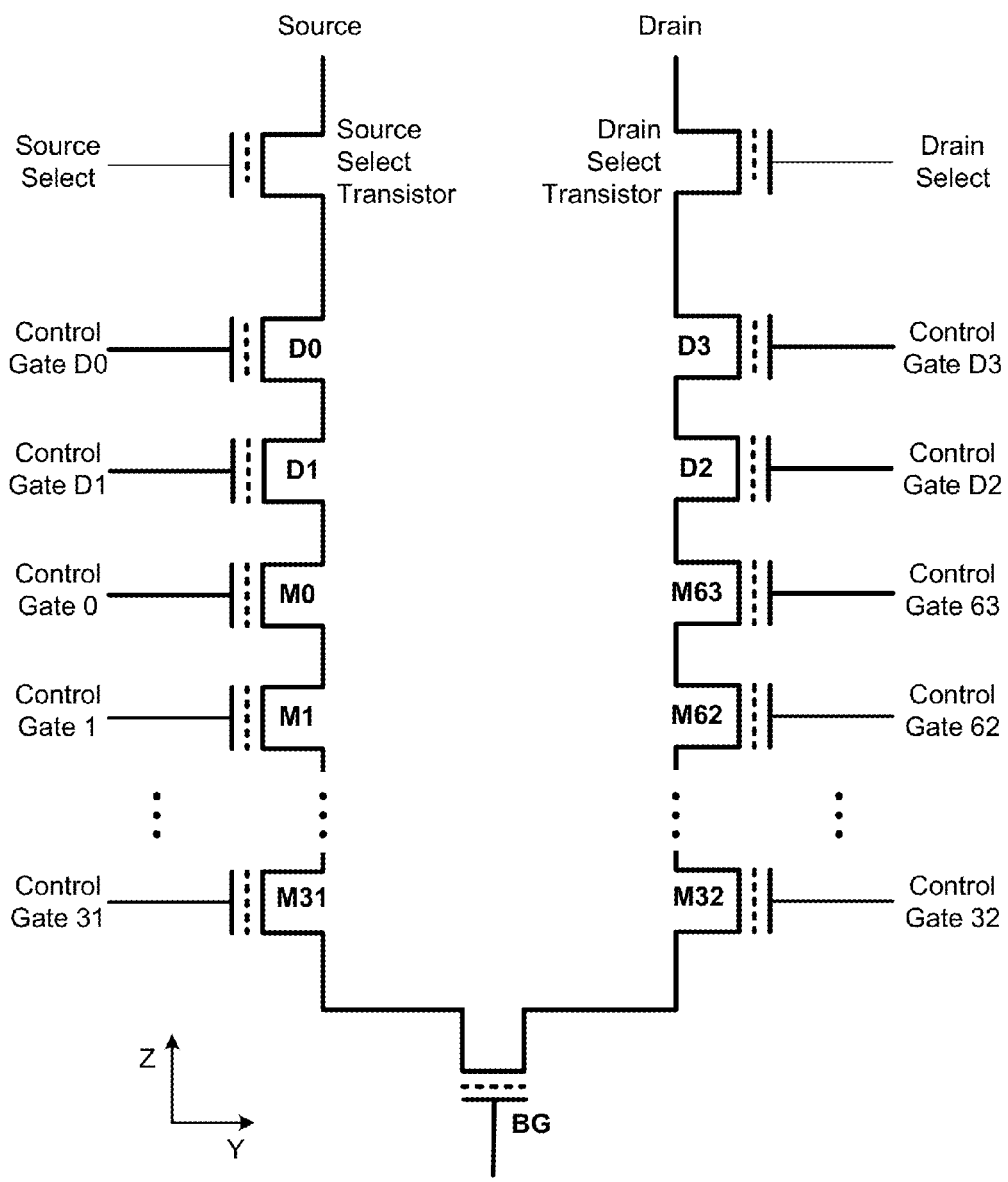
FIG. 9 shows an example of a NAND string with select transistors and dummy cells.

FIG. 9 is a schematic showing a U-shaped NAND string similar to those of FIG. 7. (Not all cells are shown for clarity of illustration; dashed lines indicate omitted memory cells.) Source and drain transistors connect either end of the string to external terminals and a back gate "BG" connects the two sides of the U-shaped NAND string. Two dummy cells, D0 and D1, are provided at the source end of the string, and two dummy cells, D2 and D3, are provided at the drain end of the string, for a total of four dummy cells in the string (in contrast, FIG. 7 showed one dummy cell at each end for a total of two dummy cells per string). Other examples may have different numbers of dummy cells. For example, where sub-block erase is used, dummy cells may be located along boundaries between sub-blocks.

Source and drain select transistors are provided at either end of the string to allow the string to be selectively connected to external connections for reading, writing, and erasing. A source select transistor is configurable (through a voltage applied to the source select line) to connect the source end of the NAND string to a source terminal (e.g. to a common source line). A drain select transistor is configurable (through a voltage applied to the drain select line) to connect the drain end of the NAND string to a drain terminal (e.g. to a bit line). In contrast to the select transistors S1 and S2 of FIG. 4A, these select transistors include charge storage elements (as indicated by dotted line). Charge that is trapped in such charge storage elements may affect the threshold voltages of the select transistors in the same way that charge trapped in charge storage elements of memory cells affects memory cell threshold voltage.

Figure 10A:
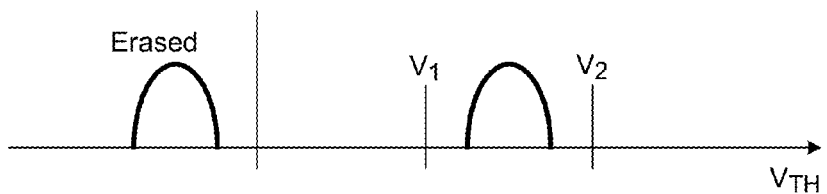
FIGS. 10A-10D show examples of threshold voltage distributions for select transistors.
Figure 10B:
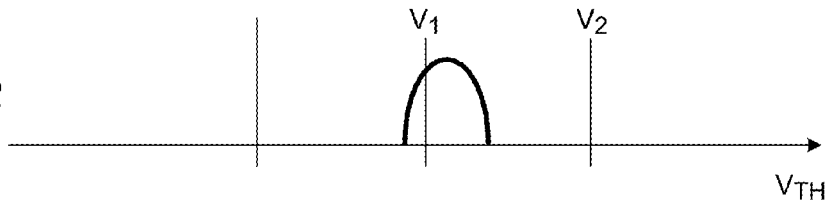
Figure 10C:
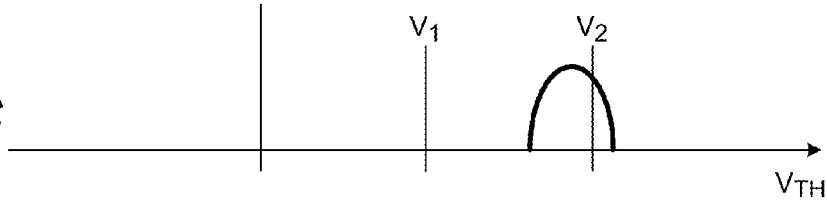
Figure 10D:
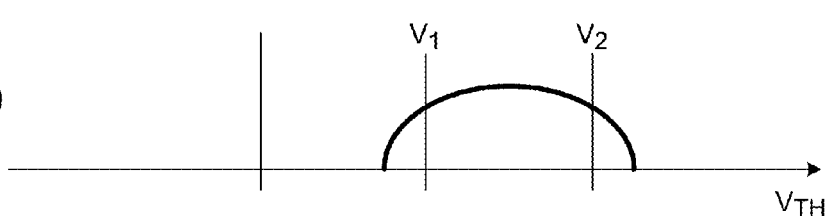

In some cases, the threshold voltage of a select transistor may be tuned to a desired range so that it turns on and off when corresponding voltages are applied to its select line. This means bringing the threshold voltage to a desired range that may be similar to one of the ranges shown in FIG. 6, or may be different. FIG. 10A shows an example of a distribution of select transistors in a desirable threshold voltage range that is between $V_1$ and $V_2$. If the threshold voltage of a select transistor changes significantly from this range then the select transistor may not turn on and off as required. If charge in the charge storage element either increases or decreases so that the charge is outside a specified range the select transistor may no longer operate as specified. In order to have all strings operating correctly as their gates are driven by predetermined voltages it is necessary to have threshold voltages of select gates within a certain window (i.e. a reasonably narrow distribution). If select transistors lose charge (threshold voltage distribution shifts down) as shown in FIG. 10B or gain charge (threshold voltage distribution shifts up) as shown in FIG. 10C, or if select transistors have random changes in charge levels (threshold voltage distribution becomes wider) as shown in FIG. 10D then problems may occur.

As in planar NAND, the current through a string under different word line bias conditions is used to determine the state of memory cells along the selected word line. Thus, source and drain select transistors, which are connected in series with the memory cells may affect how a memory cell is read. In principle, all unselected word lines and the source and drain select gates of a string have high voltages applied to make the unselected memory cells and the select transistors turn on. However, if select transistors have acquired significant charge in their charge storage elements then they may not fully turn on and may provide significant series resistance. Such series resistance may cause a misreading. Similarly, during programming along a selected string, additional resistance from select transistors may affect verification and thus cause cells to be incorrectly programmed.

Source and drain select transistors are also required to turn off in order to isolate strings from source terminals and drain terminals at certain times (e.g. isolating unselected strings during reading of a selected string). If a select transistor threshold voltage is too low then the select transistor may not turn off adequately thus keeping some connection between an unselected string and source and/or drain terminals. This may allow some current through unselected strings which affects bit line current and may cause data to be misread. Various other problems may result from failure of select transistors to turn on or turn off as required.

In order to maintain the threshold voltage of a select transistor within a desired range, the threshold voltage may be monitored to see if it is within the predetermined range and restore it to the predetermined range if it is no longer within the predetermined range. The threshold voltage may be monitored periodically during the lifecycle of the memory (e.g. based on a time stamp or other time indicator), or may be monitored in response to some triggering event. Hot count (the number of write/erase cycles) may be used to trigger monitoring. For example, select transistors may be monitored every N cycles (e.g. every 1000 cycles). Alternatively, monitoring may be performed in response to increasing numbers of ECC errors so that when the number of ECC errors exceeds a threshold number then monitoring is performed. Other triggering events may also be used.

Figure 11:
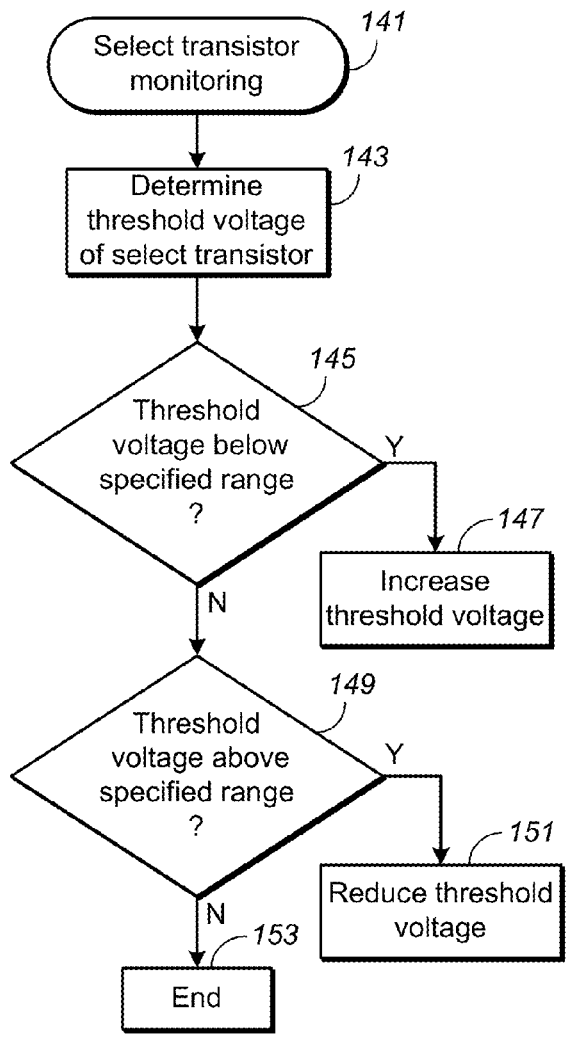
FIG. 11 illustrates a scheme for select transistor monitoring.

FIG. 11 shows an example of a scheme to monitor a select transistor 141. Initially, the threshold voltage of a select transistor is determined 143. This determination may be performed in a similar manner to reading a memory cell (e.g. memory cells are turned on and a sense amplifier is used to sense current or voltage on the bit line while one or more voltages are applied to the select line that controls the select transistor). If the threshold voltage is below the specified range 145 then an operation may be carried out to increase the threshold voltage 147. If the threshold voltage is above the specified range 149 then an operation may be carried out to reduce the threshold voltage 151. If the threshold voltage is within the specified range (neither above nor below the specified range) then the monitoring operation ends 153 and the select transistor may continue to be used without change.

Where the desirable threshold voltage range of a select transistor is greater than zero (i.e. some charge on the charge storage element is desirable) the threshold voltage may fall below the desired range through current leakage. Such leakage corresponds to similar leakage in memory cells which is related to data retention issues. Loss of charge through such leakage may be counteracted by adding charge in an operation that is analogous to a programming operation applied to a memory cell.

Figure 12:
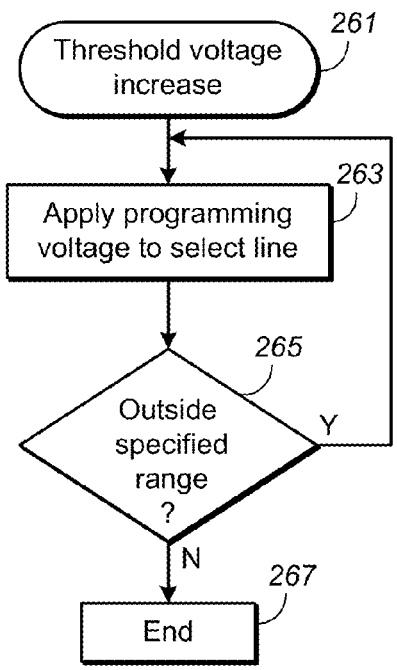
FIG. 12 illustrates a scheme for increasing threshold voltage.

FIG. 12 shows an example of an operation to increase the threshold voltage of a select transistor 261 by a series of steps. A programming voltage is supplied to the select line that connects to the gate of the select transistor while the channel is kept at a low voltage 263. The programming may be performed by applying one or more pulses, with different pulses having the same or different voltages. After a given pulse, or series of pulses, a verification step determines if the threshold voltage is outside the specified range 265. If it remains outside the specified range then another pulse, or series of pulses, is applied. If the threshold voltage is within the specified range then the operation ends 267 and the select transistor is ready for use.

The operation of FIG. 12 may be used as part of memory configuration or initialization. For example, where the desirable range of threshold voltage is not the threshold voltage of a newly-manufactured select transistor then an operation may be performed after manufacturing, prior to use, to bring the threshold voltage within the desired range. Such initial tuning of the select transistor threshold voltage may be performed at the factory, or later, after the product is shipped, for example when it is first powered on.

Figure 13:
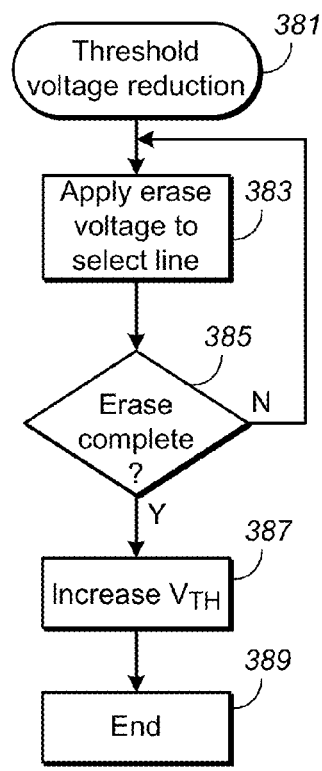
FIG. 13 illustrates a scheme for decreasing threshold voltage.

If the threshold voltage of the select transistor is too high then it may be reduced as shown in FIG. 13. A threshold voltage reduction operation 381 may be considered to be analogous to an erase operation applied to a memory cell. An erase voltage is applied to the select line of the select transistor 383. This may be a low voltage. At the same time a positive voltage is applied to the channel of the NAND string. After this step, a determination is made as to whether the select transistor is fully erased 385. The steps are repeated until it is determined to be fully erased. In many cases, the desired threshold voltage range is not the erased state, so that the erase operation is followed by increasing the threshold voltage 387 (e.g. according to FIG. 12) in order to return the threshold voltage to the desired range. In some schemes, tuning always includes erasing prior to increasing the threshold voltage by adding charge. In other schemes, charge may be added without necessarily erasing first. Once the desired threshold voltage range is achieved, the process ends 389.

Monitoring and tuning select transistor threshold voltage may be performed on any grouping of select transistors. For example, all select transistors of a block may be monitored and tuned together, or monitoring and tuning may be performed on a select line by select line basis. In some cases, multiple blocks may be treated together as a unit for monitoring and tuning of select transistor threshold voltages.

In many cases, patterns of change may be observed in threshold voltages of select transistors. For example, all select transistors of a block may show an increase, or decrease, in threshold voltage at a reasonably predictable rate. In such cases, it may not be necessary to perform tuning on a transistor-by-transistor, or line-by-line basis. One or more sample transistors may be taken as representative of a group of transistors. Conditions that return the sample transistors to the desired threshold voltage range may be assumed to return other similar transistors to the desired threshold voltage range. Thus, one select line in a block may be considered as a sample that is subject to erase until it is confirmed that select transistors along the line have threshold voltages corresponding to an erased condition. Other select transistors may be subjected to the same erase conditions without separate erase verification (i.e. it may be assumed that they will be similarly erased by the same conditions). One or more select lines may similarly be considered as samples when increasing threshold voltage also, with verification applied to only sample transistors, and other transistors simply subjected to the same conditions without necessarily being separately verified.

Dummy Cells

In some cases, one or more memory cells in a NAND string may be considered as dummy cells that are not used to store data. For example, as shown in FIGS. 7 and 9, a memory cell, or two memory cells immediately adjacent to a select transistor may be dummy cells. These cells may be considered unreliable for storage of data because of the effects of adjacent select transistors. Thus, rows of dummy cells may be formed, connected by dummy word lines. In many cases, such dummy cells are largely ignored during operation of a memory array as they do not contain data (no data is programmed or read in such cells). However, charge storage elements of such cells may acquire or lose charge during access to other cells. Therefore, their threshold voltages may shift over time. As a result, such cells may not respond as expected when a voltage is applied to their control gate. For example, they may fail to turn on fully when required. Where dummy word lines are over-driven to boost channel voltage, changes in dummy cell threshold voltages may affect boosting and thus, for example, impact unselected strings during programming.

In general, the approach described above, that is used to tune threshold voltages of select transistors, may also be used to tune threshold voltages of dummy cells. For example, dummy cells may be subject to an initialization procedure that adds charge to their charge storage elements so that their threshold voltages fall within a desirable range. Dummy cells may be subject to monitoring of their threshold voltages and may be returned to their specified threshold voltage ranges when monitoring indicates that their threshold voltages are outside of a specified range. Monitoring, threshold voltage increasing, and threshold voltage reduction in dummy cells may be performed as in FIGS. 11, 12, and 13 respectively.

While select transistors and dummy memory cells may be similarly monitored and may have their threshold voltages similarly tuned, these operations may be performed separately (although performing them together may be convenient in some cases). For example, monitoring of select transistors may be triggered by a first triggering event while monitoring of dummy cells may be triggered by a different event. Select transistors may be tuned to a first threshold voltage range, while dummy memory cells are tuned to a second threshold voltage range. Where multiple dummy word lines are present in a string they may be separately monitored and tuned, or may be monitored and tuned together. Select transistor and dummy cell tuning may be done in conjunction with operations directed to the memory cells (e.g. when a block is garbage collected) or may be done independently, e.g. while the memory cells continue to hold valid data. Select transistor and dummy cell monitoring and tuning may be performed as background operations that are performed when the memory array is idle, or may be performed in the foreground with a signal provided to indicate that the memory is busy.

Figure 14:
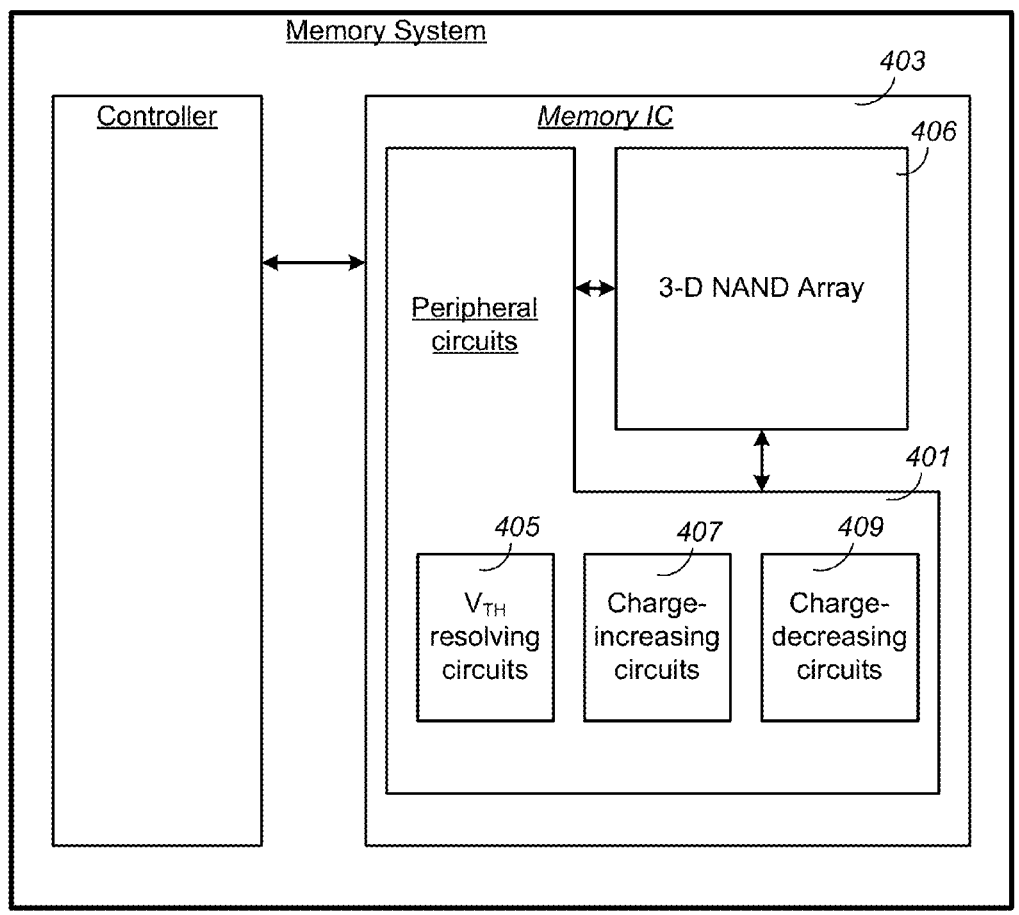
FIG. 14 shows an example of hardware for managing select transistors and dummy cells.

Various hardware may be used to carry out aspects of the present invention. FIG. 14 shows one example where peripheral circuits 401 on a memory chip 403 include threshold voltage resolving circuits 405 to resolve the threshold voltages of select transistors and/or dummy cells in a 3-D NAND array 406 (different embodiments may have one or the other, or both). Such circuits may be similar in configuration to reading circuits used to read memory cells. Also shown are charge-increasing circuits 407, which also may be for select transistors and/or dummy cells. Charge-increasing circuits may be similar to programming circuits used to program data to memory cells. However, charge-increasing circuits generally add charge uniformly to select transistors or dummy cells to bring them to a uniform specified level, whereas programming circuits program memory cells to various levels that reflect data to be stored. Also shown are charge-decreasing circuits 409, which may be for select transistors and/or dummy cells. Charge-decreasing circuits may be similar to erase circuits used to erase memory cells.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a three dimensional charge-storage memory formed in multiple physical levels disposed above a substrate comprising:
   determining a threshold voltage of a select transistor that is connected in series with a vertical string of memory cells;
   comparing the threshold voltage of the select transistor with a desirable range of select transistor threshold voltage;
   in response to determining that the threshold voltage of the select transistor is outside of the desirable range of select transistor threshold voltage, performing an operation to change the threshold voltage of the select transistor; and
   subsequently, verifying the threshold voltage of the select transistor; and
   performing corresponding operations on other select transistors using the set of conditions without subsequently verifying the threshold voltages of the other select transistors.

2. The method of claim 1 wherein the operation to change the threshold voltage adds charge to a charge storage element of the select transistor.

3. The method of claim 1 wherein the operation to change the threshold voltage removes charge from the charge storage element of the select transistor.

4. The method of claim 1 wherein the operation to change the threshold voltage first removes charge from a charge storage element of the select transistor and then adds charge to the charge storage element of the select transistor.

5. The method of claim 1 further comprising determining a threshold voltage of a dummy memory cell that is connected in series with the string of memory cells, the dummy memory cell containing no data.

6. The method of claim 1 wherein the determining, the comparing, and the performing are steps in an initialization for the three dimensional charge-storage memory array.

7. The method of claim 1 wherein the determining, the comparing, and the performing are steps performed in response to a triggering event after the three dimensional charge storage memory array has been used for a period of time.

8. The method of claim 7 wherein the triggering event is either: (a) the period of time exceeds a predetermined threshold, (b) the select transistor experiences wear that exceeds a predetermined amount, or (c) Error Correction Code (ECC) results indicate increased errors in the string of memory cells that is connected in series with the select transistor.

9. The method of claim 1 wherein performing the operation to change the threshold voltage of the select transistor includes applying one or more pulses of programming voltage to a select line connected to a select gate of the select transistor.

10. The method of claim 1 wherein performing the operation to change the threshold voltage of the select transistor includes applying an erase voltage to a select line connected to a select gate of the select transistor.

11. The method of claim 1 wherein the select transistor is a source select transistor connected in series between the vertical string of memory cells and a source terminal, the source select transistor controlled by a source select gate that is connected to a source select line.

12. The method of claim 1 wherein the select transistor is a drain select transistor connected in series between the vertical string of memory cells and a drain terminal, the drain select transistor controlled by a drain select gate that is connected to a drain select line.

13. A method of operating a three dimensional charge-storage memory formed in multiple physical levels disposed above a substrate comprising:
   determining threshold voltages of select transistors and dummy cells that are connected in series with vertical strings of memory cells;
   comparing the threshold voltages of the select transistors with a desirable range of select transistor threshold voltage;
   in response to determining that the threshold voltages of select transistors are outside of the desirable range of select transistor threshold voltage performing an operation to change the threshold voltages of the select transistors;
   subsequently, verifying the threshold voltages of the select transistors;
   performing corresponding operations on other select transistors using the set of conditions without subsequently verifying the threshold voltages of the other select transistors;
   comparing the threshold voltages of the dummy cells with a desirable range of dummy cell threshold voltage; and
   in response to determining that the threshold voltages of dummy cells are outside of the desirable range of dummy cell threshold voltage, performing an operation to change the threshold voltages of the dummy cells.

14. The method of claim 13 wherein the operation to change the threshold voltages of the select transistors includes removing charge from select transistors and subsequently adding charge to select transistors.

* * * * *